| United States Patent [19] | [11] 3,975,308 |
|---|---|
| Myles et al. | [45] Aug. 17, 1976 |

[54] PREPARATION OF PYROPHOSPHATES

[75] Inventors: Thomas A. Myles, Township of Tonawanda; Curtis E. Zimmer, Youngstown, both of N.Y.

[73] Assignee: The Carborundum Company, Niagara Falls, N.Y.

[22] Filed: Feb. 7, 1975

[21] Appl. No.: 548,118

[52] U.S. Cl............................... 252/520; 252/500; 252/518; 252/521; 252/950; 252/951; 423/305

[51] Int. Cl.².......................................... H01B 1/06

[58] Field of Search............. 252/500, 518, 62.3 BT, 252/950, 951, 521, 520; 423/315, 305, 314; 106/286

[56] References Cited
UNITED STATES PATENTS 3,849,344  11/1974  McMurtry et al. ............. 423/304 X
3,852,086  12/1974  Murata et al. ...................... 106/286

OTHER PUBLICATIONS

Chemical Abstracts, vol. 68 (1968), 45850x, "Microscopic Study of Products of the Reaction of Silica with Orthophosphoric Acid."

*Primary Examiner*—Benjamin R. Padgett
*Assistant Examiner*—E. Suzanne Parr
*Attorney, Agent, or Firm*—David E. Dougherty; Raymond W. Green

[57] ABSTRACT

A method for the preparation of pyrophosphates such as $SiP_2O_7$ is disclosed, whereby the undesired formation of by-products such as $Si_2P_2O_9$ is minimized. Such pyrophosphates are particularly suitable for the formation of solid semi-conductor diffusion sources, wherein the presence of by-product is seriously detrimental.

9 Claims, No Drawings

PREPARATION OF PYROPHOSPHATES

BACKGROUND OF THE INVENTION

In the manufacture of semiconductor devices and integrated circuits, shallow phosphorous donor diffusion into silicon is utilized to provide n-type doping. Recent developments in this technology have led to solid planar diffusion sources comprising suitable compounds of phosphorous. Various material compositions have been utilized in seeking an acceptable diffusion substance in wafer form. Since many compounds are known which decompose at elevated temperatures to yield $P_2O_5$ in vapor form, such materials have been investigated.

Silicon pyrophosphate ($SiP_2O_7$) has been found to be most suitable as the active component in such systems. To provide added high temperature strength, compatible inert binding materials have been utilized. U.S. Pat. No. 3,849,344, issued Nov. 19, 1974 to McMurtry and Murata, discloses reaction products of phosphorous and silicon oxides such as $SiO_2.P_2O_5$, $2SiO_2.P_2O_5$, and $SiO_2.2P_2O_5$, with a silicon-containing inert phase such as $SiO_2$, $Si_3N_4$, or Si. U.S. Pat. No. 3,852,086, issued Dec. 3, 1974 to Murata and McMurty teaches the use of additive materials having melting points greater than about 2000°C, such as $ZrO_2$, $ZrSiO_4$, and MgO. U.S. patent application Ser. No. 500,765, filed Aug. 26, 1974 now U.S. Pat. No. 3,931,056 discloses the preparation of cold-pressed and sintered wafers comprising $SiP_2O_7$ and $ZrP_2O_7$. Such solid planar diffusion sources as are disclosed in these references provide solid, non-toxic, convenient, and uniform phosphorous sources which may be utilized in existing conventional equipment.

However, it has been found that careful control of the phase relations in such a system is critical. Specifically, it has been found that close control of the ratio of $SiO_2$ to $P_2O_5$ is required. For example, compounds such as $SiP_2O_7$, $Si_3P_2O_{11}$, $Si_2P_2O_9$, and $SiP_4O_{12}$ have been reported in the past, with more recent work confirming the existence of both $SiP_2O_7$ ($SiO_2.P_2O_5$) and $Si_2P_2O_9$ ($2SiO_2.P_2O_5$). These latter compounds may be referred to as the 1:1 compound and the 2:1 compound, respectively, based upon the ration of $SiO_2$ to $P_2O_5$ present. It has also been found that the 1:1 compound exists in two forms, a high allotropic and a low allotropic form, having distinct x-ray patterns. The low temperature 1:1 compound reversibly inverts at about 1030°C to the beta high temperature form which melts congruently at about 1290°C, while the 2:1 compound ($Si_2P_2O_9$) melts incongruently at 1120°C to a silica-rich liquid and $SiP_2O_7$. The presence of $Si_2P_2O_9$ (the 2:1 compound) may thus be seen to present a potential problem, for use in phosphorous doping wafers, due to its relatively low melting point. Due to the formation of a silica-rich liquid at about 1120°C, any multi-component structure containing this 2:1 compound would inherently be weakened if used at higher temperatures. Thus, any silicon pyrophosphate to be used as a planar diffusion source at a temperature greater than about 1000°C should be free of the 2:1 compound.

Since synthesis reactions for $SiP_2O_7$ commonly yield $Si_2P_2O_9$ as a by-product, a method has been sought for the elimination of the $Si_2P_2O_9$ by-product in the production of the silicon pyrophosphate.

Similarly, both $ZrP_2O_7$ and $Zr_2P_2O_9$ compounds have been found to exist. The low temperature form of the 1:1 compound dissociates to the 2:1 compound, releasing $P_2O_5$ vapor. The 2:1 compound is highly stable, and has a low thermal expansion coefficient. However, the 2:1 compound ($2ZrO_2.P_2O_5$) is somewhat incompatible with $SiP_2O_7$, while the high temperature phase of the 1:1 compound ($ZrO_2.P_2O_5$) is fully compatible with $SiP_2O_7$. Since the 2:1 $SiO_2.P_2O_5$ compound possesses the low incongruent melting point previously noted, the combination of 1:1 $SiO_2.P_2O_5$ with 1:1 $ZrO_2.P_2O_5$ clearly yields the most desirable material system for solid phosphorous dopants based upon these materials.

SUMMARY OF THE INVENTION

This invention relates to a method for the synthesis of pyrophosphate materials, such as $SiP_2O_7$ and $ZrP_2O_7$. Specifically, the invention relates to a synthesis method whereby the formation of the 2:1 compound $Si_2P_2O_9$ and $Zr_2P_2O_9$, is avoided. By providing a 40 percent stoichiometric excess of $P_2O_5$ (dihydrogen ammonium phosphate, $NH_4H_2PO_4$) for combination with $SiO_2$ (silicic acid, $2SiO_2.H_2O$), and utilizing a rapid rate of temperature increase, the formation of the 2:1 compound is minimized.

DETAILED DESCRIPTION OF THE INVENTION

The formation of undesirable 2:1 forms of silicon pyrophosphate may be minimized by providing a minimum of 1.4 times the stoichiometrically necessary amount of ammonium dihydrogen phosphate for reaction with the oxide, according to the formula:

$$4NH_4H_2PO_4 + 2SiO_2.H_2O \rightarrow 2SiP_2O_7 + 4NH_3 + 7H_2O \quad (1)$$

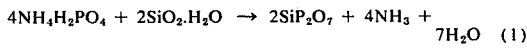

It has been learned that when a 40 percent stoichiometric excess of the $P_2O_5$ source is not available, the compound $2SiO_2.P_2O_5$ is formed. This undesirable reaction is most notable when relatively low heating rates are applied in the synthesis. That is, an interrelationship exists between heating rate and mix composition.

The heating rate used in the synthesis has a critical effect upon inhibiting $Si_2P_2O_9$ formation, as well as promoting the proper reaction between the raw materials. Heating rates below 200°C per hour consistently result in the formation of $Si_2P_2O_9$. Heating rates were determined by placing the blended raw materials into a container which in turn was entered into a furnace, to which power was applied at a specified level, and the heating rate determined after the synthesis reaction temperature was attained. The fastest heating rate attained was that resulting from injecting the raw material powders directly into a container which was at the reaction temperature (700°–725°C). With proper insulation in the furnace, and adequate power input, heating rates of 1000°C to 2000°C per hour can be attained. Such high rates result in excellent product formation, with little or no detrimental $Si_2P_2O_9$ formation, using stoichiometric amounts of the reactants. However, when a 40 percent stoichiometric excess of the ammonium phosphate monobasic is present, lower heating rates may be utilized without the formation of $Si_2P_2O_9$. Keeping in mind that even the smallest amount of this phase is detrimental to the thermal stability of a $SiP_2O_7$ doping source, additions of excess ammonium phosphate were made to determine the level at which $Si_2P_2O_9$ formation ceased. Additions of 5, 10, 20, 30 and 40 weight percent excess of the ammonium phosphate monobasic were made to batches subjected to heating rates of 200°C per hour. Resulting products were monitored by x-ray analysis, and minute amounts of $Si_2P_2O_9$ were detected. However, when the heating rate was raised to above 200°C per hour, and the ammonium phosphate was present in 40 percent excess or more, no $Si_2P_2O_9$ formation occurred.

A third influence in the reduction of $Si_2P_2O_9$ formation is sufficient hold time at the reaction temperature, about 700°C to 750°C, to allow for complete conversion to the high allotropic form of $SiP_2O_7$. This hold time may be varied down to about 4 hours or up to about 8 hours, depending on the firing rate and the maximum temperature utilized. With less than about 4 hours reaction time, $Si_2P_2O_9$ formation may be a problem due to incomplete reaction of the reagents. Beyond 8 hours, sufficient $SiP_2O_7$ may be volatilized at temperatures above about 800°C, to form additional $Si_2P_2O_9$. Alternatively, the raw materials may be flushed at 700°C for one hour, and then heated to 900°C for about 2 hours. This arrangement yields a sufficient time and temperature combination to yield a conversion to $SiP_2O_7$ without the formation of undesired 2:1 compound, $Si_2P_2O_9$.

The raw materials used in the preparation of $SiP_2O_7$ are dihydrogen ammonium phosphate, $NH_4H_2PO_4$, and silicic acid, $2SiO_2 \cdot H_2O$. The dihydrogen ammonium phosphate is a dry powder, and thus easily processed for weighing and mixing at room temperature. This compound forms an active $P_2O_5$ at about 200°C in air, according to the formula:

$$2NH_4H_2PO_4 = P_2O_5 + 2NH_3 + 3H_2O \qquad (2)$$

The active $P_2O_5$ thus released at 200°C reacts with silica, thusly:

$$P_2O_5 + SiO_2 = SiP_2O_7 \qquad (3)$$

The silica source, silicic acid, is also a dry powder at room temperature, and produces an active silica after dehydration at about 150°C. The silica thus obtained reacts with $P_2O_5$ in accordance with Formula (3), at relatively low temperatures, e.g., 700°C. Silica sand, which is a natural material, has relatively high purity, up to 99.8 percent $SiO_2$. However, silica sand is quite stable up to its melting point, about 1710°C in air, and may require higher synthesis temperatures and a longer reaction time.

Alternative sources of $P_2O_5$ and $SiO_2$ may of course be used. For example, one may utilize phosphoric acids, such as $H_3PO_4$ (ortho-), $H_4P_2O_7$ (pyro-), $HPO_3$ (meta-), and $H_4P_2O_6$ (hypo-); phosphorous oxides, i.e., $P_2O_5$ and $P_2O_3$; and ammonium phosphates, such as $(NH_4)_2H_2P_2O_6$ (hypo-), $(NH_4)_2HPO_4$ (orthomono), $(NH_4)H_2PO_4$ (ortho-di), $NH_4H_2PO_2$ (hypophosphite), and $NH_4H_2PO_3$ (orthophosphite). As sources of silica, one may use, in addition to the silicic acid and silica sand previously mentioned, such silicon oxides as cristobalite, quartz, tridymite, lechatelierite, and amorphous or opal silicon oxide.

The nature of ion doping of semiconductor silicon requires high purity for the doping material of silicon pyrophosphate. When the pyrophosphate contains other compounds, such as oxides of relatively low melting point, e.g., $Fe_2O_3$, $B_2O_3$, $K_2O$, $Na_2O$, $Li_2O$, $TiO_2$, etc., these oxides may be vaporized during heating at the temperature at which doping is performed, and deposited on the surfaces of silicon wafers. The deposited oxides will form a thin film throught which the ions of the oxides may be diffused into the silicon wafers. Thus, the phosphorous diffusion process will yield unsatisfactory results due to these impurity diffusions.

Therefore, the purity of raw material used is important, and should be high. In the case of the silica sand, MIMUSIL, a trademark of the Pennsylvania Glass Sand Corporation, of New York, New York, it contains 0.08 percent $Al_2O_3$, 0.06 percent $Fe_2O_3$, 0.04 percent $TiO_2$, 0.02 percent CaO, 0.006 percent MgO and 0.001 percent $Na_2O$ plus $K_2O$. The total of these impurities is 0.207 weight percent, corresponding to 2070 ppm. In some cases of diffusion, the total impurity is required to be within the level of from 100–200 ppm.

Besides the raw material impurity, there are impurities caused by the contamination of foreign elements during fabrication processes, such as raw material mixing, firing and crushinig. As for mixing, raw material dry powder is dry mixed in a V-blender for a short time (e.g., about 10 minutes). Thus, it is unlikely that any substantial contamination from this dry mixing will be introduced. Similar alternative mixing means may, of course, be utilized.

For firing, a fused silica vessel is used, and no contamination other than silica will be introduced. In this case, firing temperatures are as low as 700°C, and no significant chemical reaction between the silica vessel and raw material occurs. In the case of firing at higher temperatures, 1160°C to 1250°C, $SiP_2O_7$ crystals also develop, and a substantial reaction between a silica vessel and raw material may be observed. Vessels composed of alumina, refractory oxides and stainless steel are to be avoided for the contamination problem they might represent.

Dry crushing of fired material may be performed using a porcelain jar with flintstones (natural silica stones) for from about one to 4 hours. In this case, it is suggested that no substantial contamination is introduced due to the low hardness of the fired material and the dry crushing. The hardness of the fired material is very low, i.e., can easily be crushed by passing it between two fingers.

As a result, the preparation of silicon pyrophosphate, $SiP_2O_7$ may be carefully done by applying (1) a dry mixing of high purity dry chemical powders using a V-blender for several minutes; (2) a synthesis of $SiP_2O_7$ compound by firing in a fused silica vessel; and (3) dry crushing the soft $SiP_2O_7$ materials thus made in a porcelain jar with flintstones. The contamination from these processes is regarded as extremely low.

Pyrophosphate materials other than silicon pyrophosphate may also be prepared using the process of this invention. This process is of particular value in those systems wherein an undesired non-stoichiometric compound forms during the conventional synthesis. Thus, the following pyrophosphates may be prepared, with little or no formation of the indicated undesirable phase:

TABLE I

| PYROPHOSPHATE | UNDESIRED COMPOUND |
|---|---|
| $Ba_2P_2O_7$ | $Ba_3(PO_4)_2$ |
| $Pb_2P_2O_7$ | $Pb_3(PO_4)_2$ |
| $Mg_2P_2O_7$ | $Mg_3(PO_4)_2$ |
| $Mn_2P_2O_7$ | $Mn_3(PO_4)_2$ |
| $ZrP_2O_7$ | $Zr_2P_2O_7$ |

As previously noted, U.S. patent application Ser. No. 500,765, filed Aug. 26, 1974, by Myles and Zimmer, now U.S. Pat. No. 3,931,056 discloses planar diffusion sources comprising $SiP_2O_7$ with an inert refractory phase, $ZrP_2O_7$. This pyrophosphate, $ZrP_2O_7$, has been found to be particularly suitable for use with $SiP_2O_7$. The principal attributes of $ZrP_2O_7$ include non-reactivity with $P_2O_5$ during decomposition of $SiP_2O_7$; resistance to decomposition to $ZrO_2$ and $P_2O_5$ through temperatures up to about 1400°C; and provision of thermal stability. Suitable proportions of $SiP_2O_7$ and $ZrP_2O_7$ range from 5 to 95 percent of each. A preferred range of proportions is from about 75 percent $SiP_2O_7/25$ percent $ZrP_2O_7$ to about 25 percent $SiP_2O_7/75$ percent $ZrP_2O_7$. Where blends of $SiP_2O_7$ and $ZrP_2O_7$ are desired, these compounds may be synthesized together after blending of raw materials, or may be blended together after individual synthesis. It is noted that separated synthesis yields richer doping wafers due to greater glass transfer when doping.

The invention is further illustrated by the following examples, although it will be understood that the examples are intended merely for the purpose of illustration and are not intended to limit the scope of the invention.

EXAMPLE I

A phosphorous-silicon reaction product is synthesized from a mixture of 355 grams of dihydrogen ammonium phosphate, $NH_4H_2PO_4$, and 107 grams of silicic acid, $SiO_2.½H_2O$. Both chemicals are reagent grade powder, and they are dry mixed for about 15 minutes using a V-blender. The batch corresponds to a composition of 50 percent $SiO_2$ and 50 mole percent $P_2O_5$.

The intimate dry mixture is poured loosely into a fused silica vessel, and the vessel heated to 700°C at a heating rate of 200°C/ hour in air, using an electrically heated laboratory furnace. After reaching 700°C, the reaction vessel is held at this temperature for 6 hours. After cooling, the reaction product is removed and ball milled to a fine powder. The powder is analyzed by x-ray diffraction to evaluate the degree of conversion. A minor proportion of $Si_2P_2O_9$ is present.

EXAMPLE II

A reaction product is synthesized in accordance with the procedure of Example I, using 497 grams of dihydrogen ammonium phosphate and 107 grams of silicic acid. This corresponds to a 40 percent excess of dihydrogen ammonium phosphate over the stoichiometric amount. Upon analysis after reaction, no $Si_2P_2O_9$ is detected in the reaction product.

EXAMPLE III

A phosphorous-silicon product is synthesized utilizing a reaction batch as set forth in Example II, but using a heating rate of only 100°C/hour to heat the reaction mass to 700°C. After 6 hours at this temperature, the reaction product is cooled, ball milled, and analyzed. A small proportion of $Si_2P_2O_9$ is present.

EXAMPLE IV

Additional silicon-phosphorous reaction products are prepared in accordance with the procedure of Example II, utilizing 10, 20 and 30 percent stoichiometric excess of dihydrogen ammonium phosphate. Upon analysis, $Si_2P_2O_9$ is detected in each instance.

EXAMPLE V

A zirconium pyrophosphate reaction product is prepared, utilizing 50 mole percent dihydrogen ammonium phosphate (1628 grams) and 50 mole percent zirconia (872 grams $ZrO_2$). The reaction mass is treated as in Exampl I, heating to a reaction temperature of 750°C at a rate of 200°C per hour. Upon analysis, a very minor proportion of $Zr_2P_2O_9$ is present.

EXAMPLE VI

A combined synthesis is conducted on the basis of a desired product comprising 50 mole percent $SiP_2O_7$ and 50 mole percent $ZrP_2O_7$. The reaction batch comprises 1070 grams dihydrogen ammonium phosphate (a 40 percent excess over stoichiometric), 128 grams of silicic acid, and 174 grams of zirconia. Upon synthesis in accordance with the procedure of Example I, the product is found to contain no $Si_2P_2O_9$. Similar syntheses are conducted, utilizing 40 mole percent excess of dihydrogen ammonium phosphate, to prepare $SiP_2O_7$-$ZrP_2O_7$ blends as set forth in TABLE II.

TABLE II

| Blend | $NH_4H_2PO_4$ | $SiO_2.1/2H_2O$ | $ZrO_2$ |
|---|---|---|---|
| 75% $SiP_2O_7$-25% $ZrP_2O_7$ | 2250 grams | 385 | 174 |
| 25% $SiP_2O_7$ - 75% $ZrP_2O_7$ | 1964 grams | 128 | 523 |

In each case, the silicon pyrophosphate is found to be free of detectable $Si_2P_2O_9$.

While the procedure of above examples has utilized a container which is placed into a furnace cavity and subjected to rapid heating to the reaction temperature, it is also possible to directly inject the reactant powders into a preheated container. This procedure yields the most rapid heating rate, approaching rates of 1000°C/hour or more. When using this technique, the reaction batch is preferably split into several portions and charged separately over a period of time in order to maintain the high reaction temperature. A period of about 6 hours then follows the final addition in order to complete the reaction to principally the high allotropic form of $SiP_2O_7$.

While the invention has been described herein with reference to certain preferred embodiments, it is to be understood that various changes and modifications may be made by those skilled in the art without departing from the concept of the invention, the scope of which is to be determined by reference to the following claims.

We claim:

1. A process for preparation of pyrophosphates selected from the group consisting of $SiP_2O_7$, $ZrP_2O_7$, $Ba_2P_2O_7$, $Pb_2P_2O_7$, $Mg_2P_2O_7$, and $Mn_2P_2O_7$ which comprises:
   a. preparing a blend of an oxide selected from the group consisting of oxides of silicon, zirconium, barium, lead, magnesium and manganese with a stoichiometric excess of at least 40 percent of a source of $P_2O_5$;
   b. placing said blend in a reaction vessel which is non-reactive with the materials in the blend;
   c. raising the temperature of said blend and reaction vessel to a reaction temperature at a rate of at least 200°C per hour;

d. maintaining said blend and reaction vessel at said reaction temperature for at least 4 hours; and
e. cooling to room temperature.

2. A process as set forth by claim 1, wherein said pyrophosphate to be prepared is selected from the group consisting of $SiP_2O_7$, $ZrP_2O_7$, $Ba_2P_2O_7$, $Mg_2P_2O_7$, $Mn_2P_2O_7$, and $Pb_2P_2O_7$.

3. A process as set forth by claim 2, wherein said oxide is silicic acid.

4. A process as set forth by claim 2, wherein said oxide is zirconia.

5. A process as set forth by claim 2 wherein said oxide comprises a blend of silicic acid and zirconia.

6. In the process for the synthesis of a pyrophosphate material selected from the group consisting of $SiP_2O_7$, $ZrP_2O_7$, $Ba_2P_2O_7$, $Pb_2P_2O_7$, $Mg_2P_2O_7$ and $Mn_2P_2O_7$ by the reaction of dihydrogen ammonium phosphate with a metallic oxide selected from the group consisting of oxides of silicon, zirconium, barium, lead, magnesium and manganese, the improvement which comprises providing a stoichiometric excess of at least 40 percent of the dihydrogen ammonium phosphate, and heating the reaction mass from room temperature to a temperature of from about 700°C to about 750°C at a rate of at least 200°C per hour.

7. The improvement set forth by claim 6, wherein said pyrophosphate is $SiP_2O_7$ and said oxide is $SiO_2 \cdot \frac{1}{2} H_2O$.

8. The improvement set forth by claim 6, wherein said pyrophosphate is $ZrP_2O_7$ and said oxide is $ZrO_2$.

9. The improvement set forth by claim 6, wherein said pyrophosphate is a mixture of $SiP_2O_7$ and $ZrP_2O_7$ and said reaction mass comprises $NH_4H_2PO_4$, $SiO_2 \cdot \frac{1}{2} H_2O$, and $ZrO_2$.

* * * * *